(12) United States Patent
Annunziata et al.

(10) Patent No.: US 10,840,441 B2
(45) Date of Patent: Nov. 17, 2020

(54) DIAMOND-LIKE CARBON HARDMASK FOR MRAM

(71) Applicant: International Business Machines Corporation, Armonk, NY (US)

(72) Inventors: Anthony Annunziata, Stamford, CT (US); Nathan P. Marchack, New York, NY (US); Eugene O'Sullivan, Nyack, NY (US); Chandrasekharan Kothandaraman, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/131,989

(22) Filed: Sep. 14, 2018

(65) Prior Publication Data

US 2020/0091418 A1    Mar. 19, 2020

(51) Int. Cl.
*H01L 43/12*    (2006.01)
*H01L 27/22*    (2006.01)
(Continued)

(52) U.S. Cl.
CPC ........ *H01L 43/12* (2013.01); *H01L 21/02115* (2013.01); *H01L 21/0332* (2013.01);
(Continued)

(58) Field of Classification Search
CPC ................ H01L 43/12; H01L 21/0332; H01L 21/02115; H01L 27/222; H01L 43/02; H01L 21/0337; H01L 21/0335
See application file for complete search history.

(56) References Cited

U.S. PATENT DOCUMENTS

| 6,633,497 B2 | 10/2003 | Nickel |
| 6,704,220 B2 | 3/2004 | Leuschner |

(Continued)

FOREIGN PATENT DOCUMENTS

| CN | 105336849 A | 2/2016 |
| DE | 60303664 T2 | 12/2006 |

(Continued)

OTHER PUBLICATIONS

S.J. Park et al., "Hard carbon mask for next generation lithographic imaging" International Symposium on Dry Process, Nov. 2006 (2 pages).

(Continued)

*Primary Examiner* — David Vu
(74) *Attorney, Agent, or Firm* — Daniel Morris; Michael J. Chang, LLC

(57) ABSTRACT

Techniques for MRAM patterning using a diamond-like carbon hardmask are provided. In one aspect, a method of forming an MRAM device includes: forming an MRAM stack on a substrate; depositing a metal hardmask layer on the MRAM stack; depositing a diamond-like carbon layer on the metal hardmask layer; forming a patterned resist on the diamond-like carbon layer; patterning the diamond-like carbon layer using the patterned resist to form a diamond-like carbon pillar; patterning the metal hardmask layer using the diamond-like carbon pillar to form a patterned metal hardmask; and patterning the MRAM stack into an MRAM pillar using the patterned metal hardmask to form the MRAM device. An MRAM device is also provided.

11 Claims, 5 Drawing Sheets

(51) Int. Cl.
  *H01L 43/02* (2006.01)
  *H01L 21/033* (2006.01)
  *H01L 21/02* (2006.01)
(52) U.S. Cl.
  CPC ...... *H01L 21/0335* (2013.01); *H01L 21/0337* (2013.01); *H01L 27/222* (2013.01); *H01L 43/02* (2013.01)

(56) References Cited

U.S. PATENT DOCUMENTS

| | | | |
|---|---|---|---|
| 7,196,955 | B2 | 3/2007 | Nickel |
| 7,611,911 | B2 | 11/2009 | Abraham et al. |
| 7,695,897 | B2 | 4/2010 | Bucchignano et al. |
| 8,008,095 | B2 | 8/2011 | Assefa et al. |
| 8,097,870 | B2 | 1/2012 | Hutchinson et al. |
| 8,691,596 | B2 | 4/2014 | Nomachi |
| 9,190,607 | B2 | 11/2015 | Nomachi |
| 9,705,077 | B2 | 7/2017 | Annunziata et al. |
| 10,461,245 | B2* | 10/2019 | Tsubata ............... H01L 43/02 |
| 2005/0079647 | A1 | 4/2005 | Abraham et al. |
| 2009/0091037 | A1 | 4/2009 | Assefa et al. |
| 2010/0196806 | A1 | 8/2010 | Bucchignano et al. |
| 2016/0072047 | A1* | 3/2016 | Seto ................. H01L 43/08 257/421 |
| 2016/0072056 | A1 | 3/2016 | Tsubata et al. |
| 2017/0194560 | A1* | 7/2017 | Satake ............ H01J 37/32816 |

FOREIGN PATENT DOCUMENTS

| | | |
|---|---|---|
| EP | 1271546 A2 | 1/2003 |
| TW | 200514079 A | 4/2005 |
| TW | I348696 B | 9/2011 |

OTHER PUBLICATIONS

P. Subramonium et al., "Low Temperature Ashable Hardmask (AHM™) Films for sub-45nm Patterning," citation information unavailable, document dated Jan. 2009 (3 pages).

English translation of CN105336849A by Zhan Xinglong, Feb. 17, 2016 (12 pages).

English translation of DE60303664T2 by Leuschner Rainer, Dec. 14, 2006 (15 pages).

English translation of TW200514079A by Abraham David William et al., Apr. 16, 2005 (10 pages).

English translation of TWI348696B by Abraham David William et al., Sep. 11, 2011 (11 pages).

Grill, "Diamond-like carbon: state of the art," Diamond and Related Materials, vol. 8, Issues 2-5, Mar. 1999, pp. 428-434.

Flege et al., "Preparation of Metal-Containing Diamond-Like Carbon Films by Magnetron Sputtering and Plasma Source Ion Implantation and Their Properties," Advances in Materials Science and Engineering, Jan. 2017 (8 pages).

* cited by examiner

DIAMOND-LIKE CARBON HARDMASK FOR MRAM

FIELD OF THE INVENTION

The present invention relates to magnetoresistive random access memory (MRAM), and more particularly, to techniques for MRAM patterning using a diamond-like carbon hardmask.

BACKGROUND OF THE INVENTION

Spin-transfer torque magnetoresistive random access memory (STT-MRAM) devices offer many benefits over semiconductor-based memories such as dynamic random-access memory (DRAM) and static random-access memory (SRAM). In order to compete with DRAM and SRAM, however, the STT-MRAM devices must be integrated into the wiring layers of standard silicon logic and memory chips.

One challenging aspect of this integration is to pattern the MRAM stack into a pillar. Since etching MRAM materials often requires methods of physically ablating material, typical hardmasks suffer significant degradation. While increasing the thickness of the hardmask offers a potential solution, there can be difficulties associated with this approach such as aspect-ratio constraints, increased redeposition due to the larger amount of material to be patterned and shadowing. Furthermore, the erosion of the hardmask scales inversely with the diameter of the devices, making it increasingly difficult to reliably fabricate and contact small devices of interest for scaling.

Therefore, techniques for improving hardmask resilience to the etch processes used to pattern the MRAM stack would be desirable.

SUMMARY OF THE INVENTION

The present invention provides techniques for magnetoresistive random access memory (MRAM) patterning using a diamond-like carbon hardmask. In one aspect of the invention, a method of forming an MRAM device is provided. The method includes: forming an MRAM stack on a substrate; depositing a metal hardmask layer on the MRAM stack; depositing a diamond-like carbon layer on the metal hardmask layer; forming a patterned resist on the diamond-like carbon layer; patterning the diamond-like carbon layer using the patterned resist to form a diamond-like carbon pillar; patterning the metal hardmask layer using the diamond-like carbon pillar to form a patterned metal hardmask; and patterning the MRAM stack into an MRAM pillar using the patterned metal hardmask to form the MRAM device.

In another aspect of the invention, an MRAM device is provided. The MRAM device includes: a substrate; an MRAM pillar on the substrate; a patterned metal hardmask disposed on the MRAM pillar; and a diamond-like carbon pillar disposed on the patterned metal hardmask.

A more complete understanding of the present invention, as well as further features and advantages of the present invention, will be obtained by reference to the following detailed description and drawings.

DETAILED DESCRIPTION OF PREFERRED EMBODIMENTS

As provided above, the etch processes used for patterning magnetoresistive random access memory (MRAM) stacks can significantly degrade conventional hardmasks, making them unreliable for most applications. Advantageously, provided herein are techniques for incorporating a diamond-like carbon (DLC) layer into the MRAM patterning process, which enables improved hardmask resilience to the etch processes used to pattern the MRAM stack.

Figure 1:
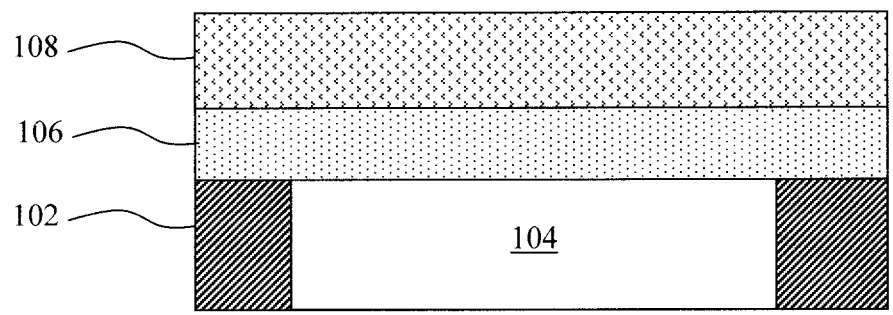
FIG. 1 is a cross-sectional diagram illustrating a substrate containing a metal landing pad, a magnetoresistive random access memory (MRAM) stack having been formed on the substrate over the landing pad, and a metal hardmask layer having been deposited onto the MRAM stack according to an embodiment of the present invention.

An overview of the present techniques is now provided by way of reference to FIGS. 1-4 which illustrate an exemplary methodology for forming an MRAM device. As shown in FIG. 1, the process begins with a substrate 102 containing a metal landing pad 104. Depending on the particular application at hand, a variety of different substrate configurations are anticipated herein. For instance, according to an exemplary embodiment, the substrate 102 is a semiconductor wafer on which the MRAM device is being fabricated. For instance, substrate 102 can be a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Alternatively, for applications where the MRAM stack is being integrated into the wiring layers of a chip design, the substrate 102 can be a metal (e.g., copper (Cu)) line common to back-end-of-line (BEOL) circuitry.

Suitable materials for the landing pad 104 include, but are not limited to, tantalum nitride (TaN) and/or titanium nitride (TiN). As shown in FIG. 1, the top surface of the landing pad 104 is coplanar with the top surface of the substrate 102. Having the landing pad 104 coplanar/flush with the substrate 102 provides a flat surface onto which the MRAM stack can be built.

Namely, an MRAM material stack (or simply "MRAM stack") 106 is next formed on the substrate 102 over the landing pad 104. Processes such as atomic layer deposition (ALD), chemical vapor deposition (CVD) and/or physical vapor deposition (PVD) can be used to deposit the layers of the MRAM stack sequentially onto the substrate 102. The particular configuration of the MRAM stack can vary depending on the application at hand, and thus is being generically represented by stack 106 in FIG. 1.

For instance, according to an exemplary embodiment, the MRAM stack includes a magnetic tunnel junction (MTJ) element that includes magnetic metal layers separated by a tunnel barrier. Suitable materials for the magnetic metal layers include, but are not limited to, cobalt (Co), iron (Fe), nickel (Ni), Co alloys, Fe alloys and/or Ni alloys. Suitable materials for the tunnel barrier include, but are not limited to, aluminum (Al) and/or magnesium (Mg) oxides. According to an exemplary embodiment, the tunnel barrier has a thickness of from about 1 nanometer (nm) to about 3 nm and ranges therebetween. An exemplary MTJ element is described in conjunction with the description of FIG. 7, below. As also described below, the MRAM stack 106 can also include a ruthenium (Ru) cap layer separated from the MTJ element by a cap layer.

In an exemplary embodiment, the orientation of the magnetization of the magnetic metal layers on one side of the tunnel barrier is fixed, while the orientation of the magnetization of the magnetic metal layers on the other side of the tunnel barrier can be switched (i.e., is free) by an applied spin polarized current tunneled through the tunnel barrier. Data is stored in the MTJ element based on the orientation of the magnetization of the free magnetic metal layer(s) relative to that of the fixed magnetic layer(s). The data can be read using the resistive state of the MTJ element which changes based on the relative orientation of the magnetization of the fixed and free layers.

A metal hardmask layer 108 is then deposited (e.g., by ALD, CVD, PVD, etc.) onto the MRAM stack 106. Suitable hardmask metals include, but are not limited to, TaN, TiN and/or tungsten (W). According to an exemplary embodiment, the metal hardmask layer 108 is deposited to a thickness of from about 500 angstroms (Å) to about 2000 Å and ranges therebetween.

Figure 2:
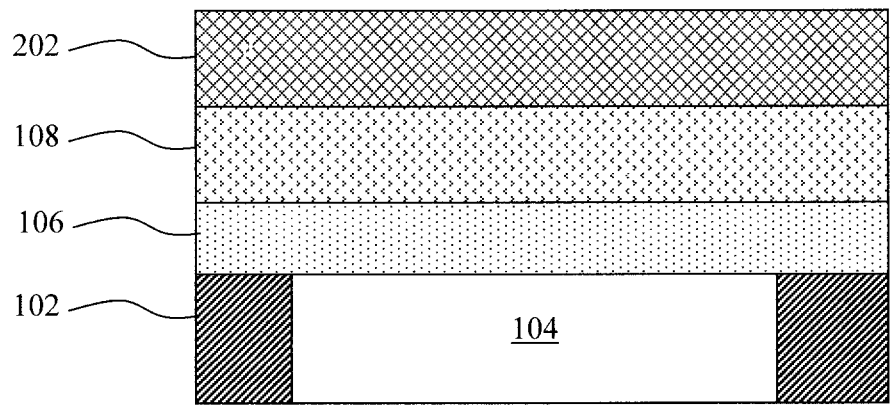
FIG. 2 is a cross-sectional diagram illustrating a diamond-like carbon layer having been formed on the metal hardmask layer according to an embodiment of the present invention.

Next, as shown in FIG. 2, a diamond-like carbon layer 202 is formed on the metal hardmask layer 108. The term "diamond-like carbon" as used herein refers generally to amorphous, hydrogenated or non-hydrogenated, forms of carbon. See also, Grill, "Diamond-like carbon: state of the art," Diamond and Related Materials, vol. 8, Issues 2-5, March 1999, pgs. 428-434 (hereinafter "Grill"), the contents of which are incorporated by reference as if fully set forth herein. By way of example only, hydrogenated forms of diamond-like carbon materials can contain up to about 50 atomic percent hydrogen (e.g., from about 10 atomic percent hydrogen to about 50 atomic percent hydrogen and ranges therebetween), whereas non-hydrogenated forms contain less than about 1 atomic percent hydrogen. As described in Grill, the significant fractions of $sp^3$ bonded carbon atoms give these materials their "diamond-like" properties. According to an exemplary embodiment, diamond-like carbon layer 202 is deposited on metal hardmask layer 108 using plasma enhanced chemical vapor deposition (PECVD) or PVD in a hydrogen ambient to a thickness of from about 100 Å to about 300 Å and ranges therebetween.

Diamond-like carbon materials themselves are not electrically conductive. Thus, in some cases, the diamond-like carbon layer 202 needs to be removed later on in the process in order to make contact with the MRAM stack 106. However, metals such as Cu and/or Ti can optionally be incorporated during deposition of the diamond-like carbon layer 202 to form a metal-containing diamond-like carbon layer 202 which is electrically conductive. See, for example, Flege et al., "Preparation of Metal-Containing Diamond-Like Carbon Films by Magnetron Sputtering and Plasma Source Ion Implantation and Their Properties," Advances in Materials Science and Engineering, January 2017 (8 pages), the contents of which are incorporated by reference as if fully set forth herein. In that case, the diamond-like carbon layer 202 can remain in place over the MRAM stack 106 in the final device.

Figure 3:
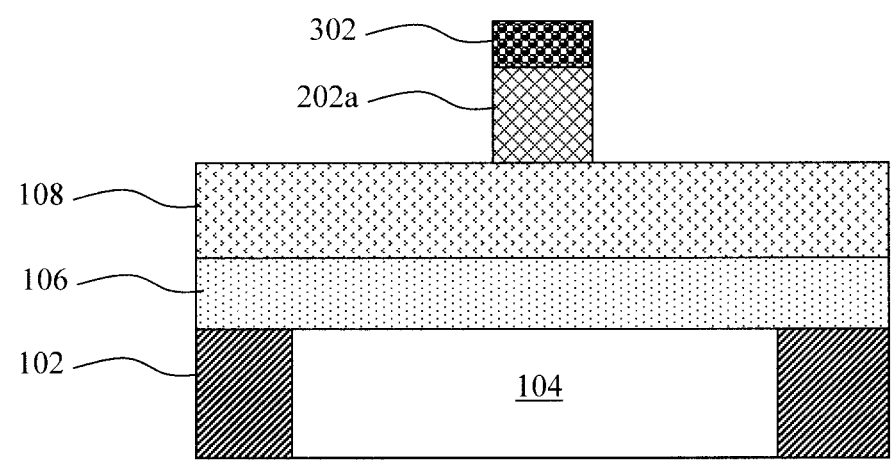
FIG. 3 is a cross-sectional diagram illustrating a patterned resist having been formed on the diamond-like carbon layer according to an embodiment of the present invention.
Figure 4:
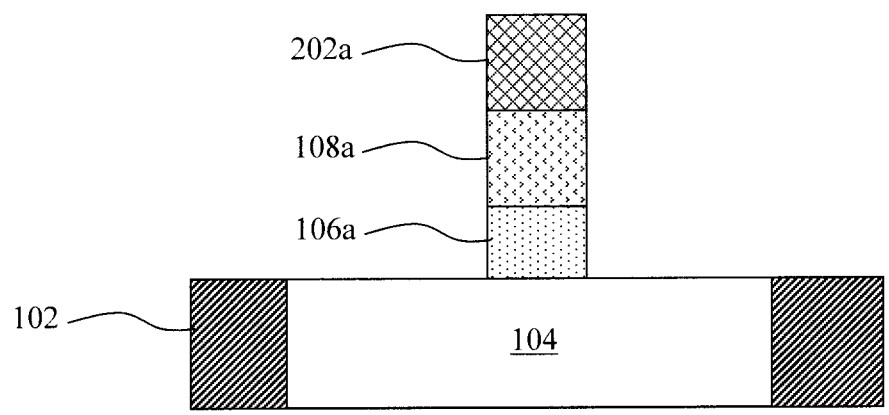
FIG. 4 is a cross-sectional diagram illustrating the diamond-like carbon pillar having been used as an etch mask to pattern the metal hardmask layer forming a patterned metal hardmask, and the patterned metal hardmask having been used to pattern the MRAM stack into an MRAM pillar according to an embodiment of the present invention.

Conventional lithography and etching techniques are then used to pattern the diamond-like carbon layer 202 into a pillar. Specifically, as shown in FIG. 3, a patterned resist 302 is formed on the diamond-like carbon layer 202. The patterned resist 302 is then used to pattern the diamond-like carbon layer 202 into a pillar 202a. A directional (anisotropic) etching process such as reactive ion etching (RIE) can be employed for the pillar etch. As will be apparent for the examples provided below, a lithography stack (e.g., anti-reflective coating (ARC) and organic planarizing layer (OPL)) may be employed in the patterning process. Following patterning of the pillar 202a, any remaining resist 302 can be removed.

The diamond-like carbon pillar 202a is then used as an etch mask to pattern the metal hardmask layer 108 forming patterned metal hardmask 108a. See FIG. 4. This hardmask open step can be performed using a directional/anisotropic etching process such as RIE. The patterned metal hardmask 108a is used to, in-turn, pattern the MRAM stack 106 into an MRAM device pillar 106a. Again, a directional/anisotropic etching process such as RIE can be employed for patterning the MRAM stack 106.

Contact to MRAM pillar 106a can be made through the patterned metal hardmask 108a. Thus, the patterned metal hardmask 108a can remain on top of the MRAM pillar 106a. Further, as provided above, a metal(s) can be incorporated into the diamond-like carbon layer 202. In that case, diamond-like carbon pillar 202a too can remain in place on top of the patterned metal hardmask 108a (i.e., MRAM pillar 106a can be accessed through the (metal-containing) diamond-like carbon pillar 202a/patterned metal hardmask 108a. On the other hand, if the diamond-like carbon layer 202 is not electrically conductive, then it will need to be removed following patterning of the MRAM pillar 106a.

Figure 5:
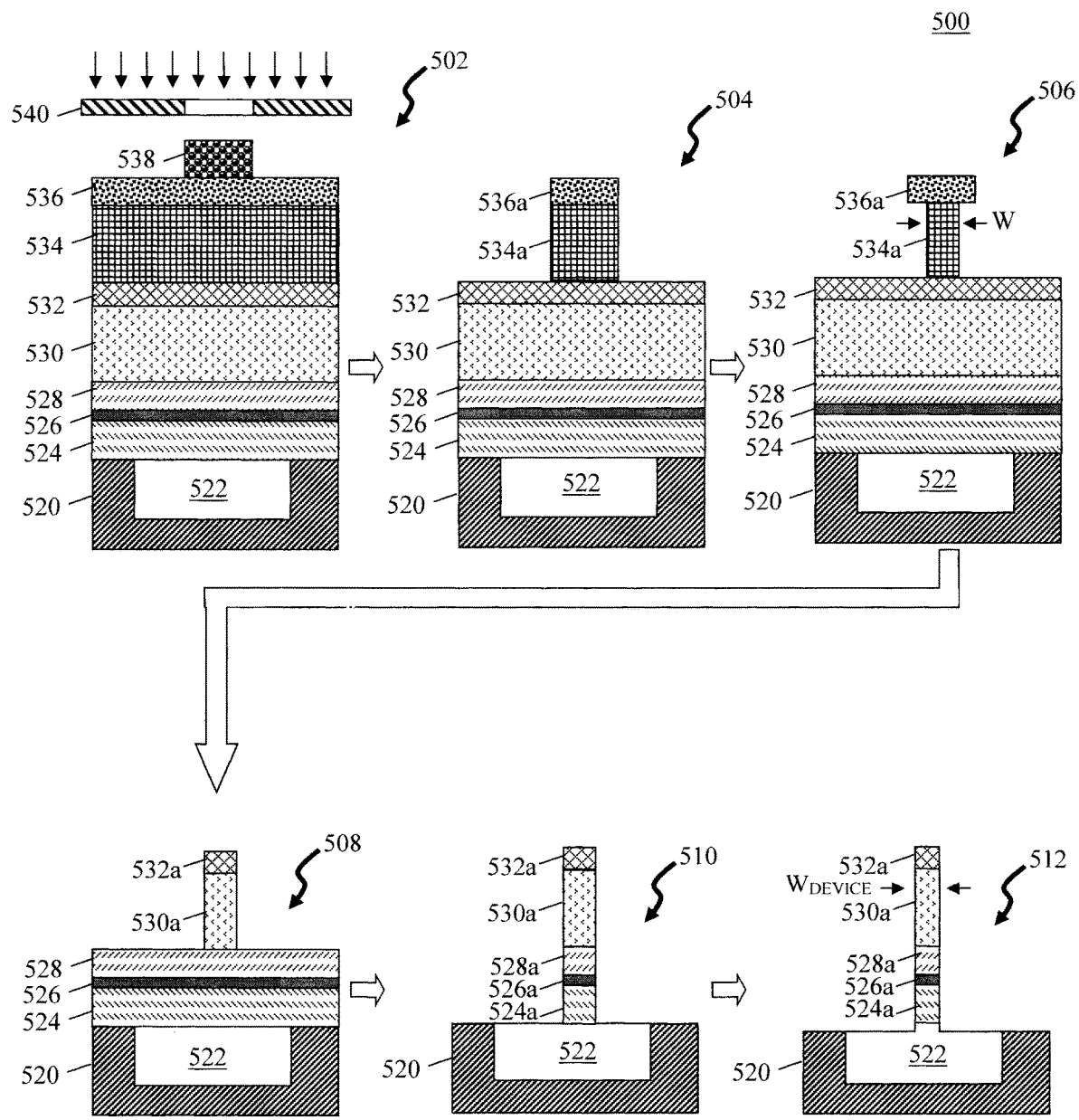
FIG. 5 is a diagram illustrating an exemplary methodology for forming an MRAM device according to an embodiment of the present invention.
Figure 6:
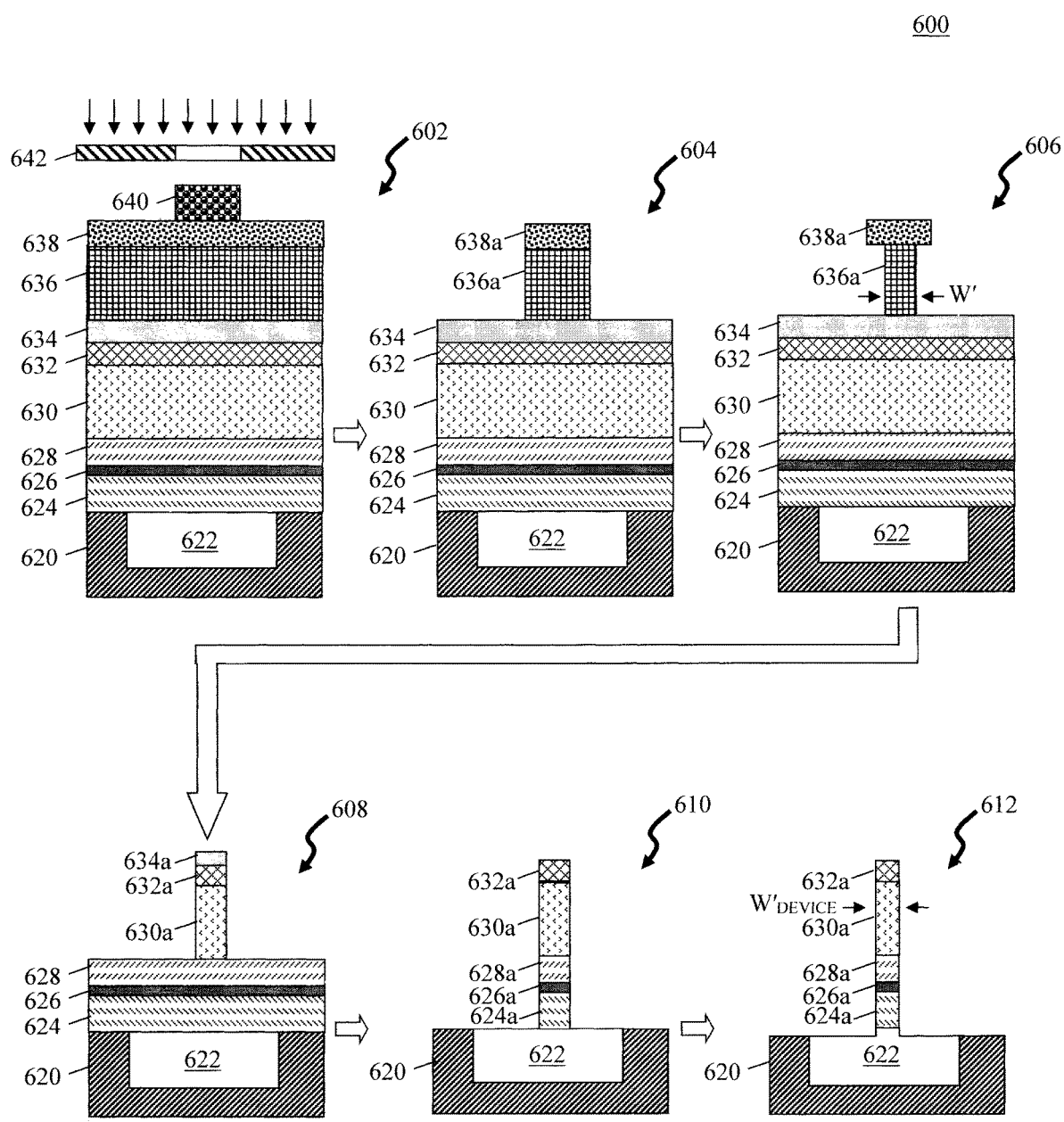
FIG. 6 is a diagram illustrating another exemplary methodology for forming an MRAM device according to an embodiment of the present invention.

Given the above overview, some exemplary process flows that leverage the present diamond-like carbon hardmasks for MRAM stack patterning are now described by way of reference to FIGS. 5 and 6. For instance, FIG. 5 is a diagram illustrating an exemplary methodology 500 for forming an MRAM device.

Following the same general process flow as above, the process begins in step 502 with a substrate 520 (e.g., semiconductor wafer, Cu line in BEOL, etc.) containing a metal landing pad 522 (e.g., TaN and/or TiN). An MRAM stack is then formed on the substrate 520 over the metal landing pad 522. In this particular example, the MRAM stack includes an MTJ element 524 separated from a Ru cap layer 528 by a cap layer 526.

A metal hardmask layer 530 (e.g., TaN, TiN and/or W) is deposited (e.g., by ALD, CVD, PVD, etc.) onto the MRAM stack, followed by a diamond-like carbon layer 532 (e.g., by PECVD or PVD). As provided above, the diamond-like carbon layer may optionally contain a metal(s) (e.g., Cu and/or Ti) thereby making it electrically conductive. Here a lithography stack is employed beneath the resist 538.

Namely, as shown in FIG. 5, the lithography stack includes an OPL 534 and an ARC 536. Embodiments are also contemplated herein where the lithography stack includes only an ARC beneath the resist 538. Suitable OPL materials include, but are not limited to, those commercially available, for example, from JSR Micro, Inc., Sunnyvale, Calif. (e.g., HM8006) and/or from ShinEtsu Chemical Co. Ltd., Tokyo, Japan (e.g., ODL-102). Suitable ARC materials include, but are not limited to, silicon-doped antireflective materials (SiARC). According to an exemplary embodiment, OPL 534 is deposited to a thickness of from about 1000 Å to about 2000 Å and ranges therebetween, and ARC 536 is deposited to a thickness of from about 100 Å to about 200 Å and ranges therebetween. In this example, a negative tone development of the resist 538 is employed, wherein a mask 540 is transparent in the area where it is desired that the resist 538 remains. See step 502.

In step 504, an etch of the ARC 536 and OPL 534 is performed using the resist 538 as a mask. A directional (anisotropic) etching process such as RIE can be employed to open the ARC 536 and OPL 534. This process leaves behind a pillar of ARC 536a and OPL 534a.

In step 506, the OPL 534a is selectively trimmed to a smaller diameter than printed by the lithography process, leaving behind an overhanging "cap" of ARC 536a protecting the underlying OPL 534a. According to an exemplary embodiment, this trimming of the OPL 534a is carried out using a plasma that etches the OPL 534a but not the ARC 536a. By way of example only, once trimmed, the OPL 534a has a width W of from about 35 nm to about 70 nm and ranges therebetween.

In step 508, an etch is performed using the ARC 536a/OPL 534a to pattern the diamond-like carbon layer 532 and metal hardmask layer 530. A directional (anisotropic) etching process such as RIE can be employed to pattern the diamond-like carbon layer 532 and the metal hardmask layer 530. Following this etch, the patterned diamond-like carbon layer and metal hardmask layer are given reference numerals 532a and 530a, respectively. The width of the patterned diamond-like carbon layer/metal hardmask layer 530a is commensurate with the width W of the (trimmed) OPL 534a which is smaller than the ARC 536a. Following patterning of the diamond-like carbon layer and metal hardmask layer, the remaining ARC 536a and OPL 534a are removed.

In step 510, an etch is performed using the patterned diamond-like carbon layer 532a/metal hardmask layer 530a to pattern the MRAM stack (i.e., Ru cap layer 528, cap layer 526 and MTJ element 524). A directional (anisotropic) etching process such as RIE can be employed to pattern the MRAM stack. Following this etch, the patterned Ru cap layer 528, cap layer 526 and MTJ element 524 are given reference numerals 528a, 526a and 524a, respectively. As provided above, if the diamond-like carbon layer 532a is electrically conductive (i.e., if a metal-containing diamond-like carbon layer is employed), then the diamond-like carbon layer 532a can remain in place over the metal hardmask layer 530a in the completed device (as shown in the present example). Otherwise, the diamond-like carbon layer 532a is removed following patterning of the MRAM stack.

Finally, in step 512, an ion beam etch is used to reduce the width of the device, i.e., diamond-like carbon layer 532a/metal hardmask layer 530a/MRAM stack, to $WD_{DEVICE}$ and simultaneously clean the sidewalls of the MRAM stack of residue that might arise from preceding RIE processes. According to an exemplary embodiment, $W_{DEVICE}$ is from about 15 nm to about 45 nm and ranges therebetween. As shown in step 512, the ion beam etch can slightly erode the metal landing pad 522 as well.

FIG. 6 is a diagram illustrating another exemplary methodology 600 for forming an MRAM device in accordance with the present techniques. Again, following the same general process flow as above, the process begins in step 602 with a substrate 620 (e.g., semiconductor wafer, Cu line in BEOL, etc.) containing a metal landing pad 622 (e.g., TaN and/or TiN). An MRAM stack is then formed on the substrate 620 over the metal landing pad 622. In this example, the MRAM stack includes an MTJ element 624 separated from a Ru cap layer 628 by a cap layer 626.

A metal hardmask layer 630 (e.g., TaN, TiN and/or W) is deposited (e.g., by ALD, CVD, PVD, etc.) onto the MRAM stack, followed by a diamond-like carbon layer 632 (e.g., by PECVD or PVD). As provided above, the diamond-like carbon layer may optionally contain a metal(s) (e.g., Cu and/or Ti) thereby making it electrically conductive.

Here a lithography stack is employed beneath the resist 640. Namely, as shown in FIG. 6, the lithography stack includes an oxide layer 634, an OPL 636 (e.g., HM8006, ODL-102, etc.) and an ARC 638 (e.g., SiARC). In this example, a negative tone development of the resist 640 is employed, wherein a mask 642 is transparent in the area where it is desired that the resist 640 remains. See step 602.

In step 604, an etch of the ARC 638 and OPL 636 is performed using the resist 640 as a mask. A directional (anisotropic) etching process such as RIE can be employed to open the ARC 638 and OPL 636. This process leaves behind a pillar of ARC 638a and OPL 636a.

In step 606, the OPL 636a is selectively trimmed to a smaller diameter than printed by the lithography process, leaving behind an overhanging "cap" of ARC 638a protecting the underlying OPL 636a. By way of example only, once trimmed, the OPL 636a has a width W' of from about 50 nm to about 70 nm and ranges therebetween.

In step 608, an etch is performed using the ARC 638a/OPL 636a to pattern the oxide layer 634, diamond-like carbon layer 632 and metal hardmask layer 630. A directional (anisotropic) etching process such as RIE can be employed to pattern the diamond-like carbon layer 632 and the metal hardmask layer 630. Following this etch, the patterned oxide layer, diamond-like carbon layer and metal hardmask layer are given reference numerals 634a, 632a and 630a, respectively. The width of the patterned oxide layer 634a/diamond-like carbon layer 632a/metal hardmask layer 630a is commensurate with the width W' of the (trimmed) OPL 634a which is smaller than the ARC 636a. Following patterning of the oxide layer, diamond-like carbon layer and metal hardmask layer, the remaining ARC 638a and OPL 636a are removed.

In step 610, an etch is performed using the patterned diamond-like carbon layer 632a/metal hardmask layer 630a to pattern the MRAM stack (i.e., Ru cap layer 628, cap layer 626 and MTJ element 624). A directional (anisotropic) etching process such as RIE can be employed to pattern the MRAM stack, which will also remove any remaining oxide 634a. Following this etch, the patterned Ru cap layer 628, cap layer 626 and MTJ element 624 are given reference numerals 628a, 626a and 624a, respectively. As provided above, if the diamond-like carbon layer 632a is electrically conductive (i.e., if a metal-containing diamond-like carbon layer is employed), then the diamond-like carbon layer 632a can remain in place over the metal hardmask layer 630a in the completed device (as shown in the present example). Otherwise, the diamond-like carbon layer 632a is removed following patterning of the MRAM stack.

Finally, in step 612, an ion beam etch is used to reduce the width of the device, i.e., diamond-like carbon layer 632a/metal hardmask layer 630a/MRAM stack, to W'$_{DEVICE}$ and simultaneously clean the sidewalls of the MRAM stack of residue that might arise from preceding RIE processes. According to an exemplary embodiment, W'$_{DEVICE}$ is from about 25 nm to about 35 nm and ranges therebetween. As shown in step 612, the ion beam etch can slightly erode the metal landing pad 622 as well.

Figure 7:
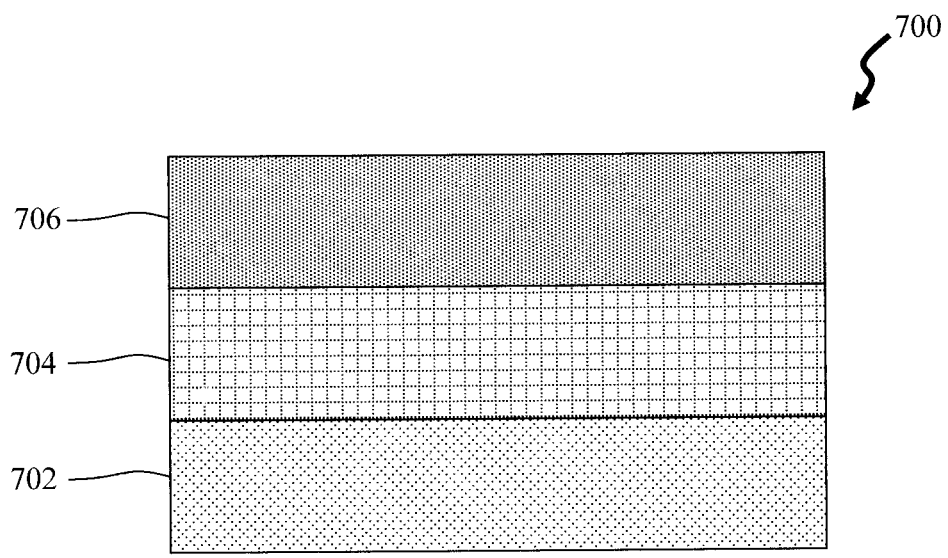
FIG. 7 is a cross-sectional diagram illustrating an exemplary magnetic tunnel junction (MTJ) element according to an embodiment of the present invention.

FIG. 7 is a diagram illustrating an exemplary MTJ element 700. As shown in FIG. 7, MTJ element 700 includes a magnetic metal layer 702 separated from a magnetic metal layer 706 by a tunnel barrier 704. As provided above, suitable materials for the magnetic metal layers 702 and 706 include, but are not limited to, Co, Fe, Ni, Co alloys, Fe alloys and/or Ni alloys.

The tunnel barrier 704 isolates magnetic metal layer 702 from magnetic metal layer 706. However, since the tunnel barrier 704 is ultra-thin, electrons can tunnel through the tunnel barrier 704 from one magnetic metal layer to the other. For instance, according to an exemplary embodiment, the tunnel barrier has a thickness of from about 2 nm to about 3 nm and ranges therebetween. As provided above, suitable materials for the tunnel barrier 704 include, but are not limited to, Al and/or magnesium oxides.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a magnetoresistive random access memory (MRAM) device, the method comprising the steps of:
    forming an MRAM stack on a substrate, wherein the MRAM stack directly contacts at least a portion of the substrate;
    depositing a metal hardmask layer directly on the MRAM stack;
    depositing a diamond-like carbon layer directly on the metal hardmask layer;
    incorporating at least one metal during deposition of the diamond-like carbon layer such that the diamond-like carbon layer is electrically conductive;
    forming a patterned resist on the diamond-like carbon layer;
    patterning the diamond-like carbon layer using the patterned resist to form a diamond-like carbon pillar;
    patterning the metal hardmask layer using the diamond-like carbon pillar to form a patterned metal hardmask; and
    patterning the MRAM stack into an MRAM pillar using the patterned metal hardmask to form the MRAM device.

2. The method of claim 1, further comprising the step of:
    fully removing the diamond-like carbon pillar after patterning the MRAM stack.

3. The method of claim 1, wherein the substrate contains a metal landing pad, the method further comprising the step of:
    forming the MRAM stack on the substrate over the metal landing pad.

4. The method of claim 1, wherein the MRAM stack comprises a magnetic tunnel junction (MTJ) element.

5. The method of claim 4, wherein the MTJ element comprises:
    a first magnetic metal layer;
    a tunnel barrier disposed on the first magnetic metal layer; and
    a second magnetic metal layer disposed on the tunnel barrier.

6. The method of claim 1, wherein the metal hardmask layer comprises tantalum nitride, titanium nitride, tungsten, and combinations thereof.

7. The method of claim 1, wherein the diamond-like carbon material comprises amorphous carbon.

8. The method of claim 7, wherein the diamond-like carbon material comprises from about 10 atomic percent hydrogen to about 50 atomic percent hydrogen and ranges therebetween.

9. The method of claim 7, wherein the diamond-like carbon material comprises less than about 1 atomic percent hydrogen.

10. The method of claim 1, wherein the diamond-like carbon material is deposited to a thickness of from about 100 Å to about 300 Å and ranges therebetween.

11. The method of claim 1, wherein the at least one metal is selected from the group consisting of: copper, titanium, and combinations thereof.

* * * * *